(12) United States Patent
Nakaji et al.

(10) Patent No.: US 7,415,185 B2
(45) Date of Patent: Aug. 19, 2008

(54) BURIED-WAVEGUIDE-TYPE LIGHT RECEIVING ELEMENT AND MANUFACTURING METHOD THEREOF

(75) Inventors: Masaharu Nakaji, Tokyo (JP); Eitaro Ishimura, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 11/774,639

(22) Filed: Jul. 9, 2007

(65) Prior Publication Data

US 2008/0144994 A1 Jun. 19, 2008

(30) Foreign Application Priority Data

Dec. 19, 2006 (JP) ............... 2006-341820

(51) Int. Cl.
*G02B 6/10* (2006.01)
(52) U.S. Cl. ............... 385/131; 385/129; 385/130; 385/132; 257/13; 257/17; 257/18; 257/19; 257/20; 257/21; 257/79; 257/80; 257/81; 257/82
(58) Field of Classification Search ......... 385/129–132; 257/17–18, 21, 13, 79–82
See application file for complete search history.

(56) References Cited

U.S. PATENT DOCUMENTS 5,889,913 A * 3/1999 Tohyama et al. ............ 385/131
6,734,519 B1 * 5/2004 Nakaji et al. ............... 257/458
7,031,587 B2 * 4/2006 Nakaji et al. ............... 385/131

FOREIGN PATENT DOCUMENTS

| JP | 10-303449 | * | 11/1998 |
| JP | 11-112013 | * | 4/1999 |
| JP | 2000-124493 | * | 4/2000 |
| JP | 2001-168371 | * | 6/2001 |
| JP | 2003-332613 | * | 11/2003 |

OTHER PUBLICATIONS

Ishimura et al., "40Gbps Waveguide Photodiode for Flip-Chip Assembly", Extended Abstracts No. 3, (The 49th Spring Meeting, 2002),The Japan Society of Applied Physics and Related Societies, pp. 1152 (Mar. 2006).*
Shimizu et al., "Waveguide Avalanche Photodiodes for 40 Gbps Communication", IEICE Technical Report, OCS2006-40, OPE2006-93, LQE2006-82, pp. 11-15 (Oct. 2006).*

* cited by examiner

*Primary Examiner*—Brian Healy
*Assistant Examiner*—Guy G Anderson
(74) *Attorney, Agent, or Firm*—Leydig, Voit & Mayer, Ltd.

(57) ABSTRACT

A buried-waveguide light detecting element includes an n-type cladding layer on a Fe-InP substrate, a waveguide on a portion of the n-type cladding layer, and in which an n-type light guide layer, an i-light guide layer having a refractive index equal to or higher than that of the n-type cladding layer and undoped or having an impurity concentration of $1 \times 10^{17}$ $cm^{-3}$ or less, lower than the impurity concentration in the n-type light guide layer, a light absorption layer having a refractive index higher than that of the i-light guide layer, a p-type light guide layer, and a p-type cladding layer are successively layered in mesa form, from the Fe—InP substrate, and a blocking layer on the Fe—InP substrate and in which side walls of the waveguide are embedded.

10 Claims, 4 Drawing Sheets

BURIED-WAVEGUIDE-TYPE LIGHT RECEIVING ELEMENT AND MANUFACTURING METHOD THEREOF

BACKGROUND OF THE INVENTION

1. Field of the Invention

The present invention relates to a buried-waveguide-type light receiving element and manufacturing method thereof, more particularly, to a buried-waveguide-type light receiving element used in an optical communication system or the like, and manufacturing method thereof.

2. Description of the Related Art

With the rapid increase in demand for communication, the development of communication systems of higher capacities has been pursued, which requires designing optical communication devices so as to increase the processing speed, reduce the size, improve the efficiency and reduce the manufacturing cost.

Optical communication transmission systems use light in two wavelength bands as signal light: a 1.3 µm band having a center wavelength of 1.3 µm, and a 1.55 µm band having a center wavelength of 1.55 µm.

Signal light in the 1.55 µm band has a low optical fiber loss and is used as signal light in a long-distance communication system, which is, for example, called an intercity communication (trunk system) and used for communication between large cities such as Tokyo and Osaka.

On the other hand, signal light in the 1.3 µm band has a higher optical fiber loss but has reduced wavelength dispersion and is used as signal light in a short-distance communication system, which is called in-city communication and used for communication in a large city. Signal light in the 1.3 µm band is also used in a system for communication between a base station and each home called an access system.

Light receiving elements having such a structure that signal light enters the element through a cleaved end face have been developed and mass-produced as a semiconductor light receiving element used in a receiving module of an optical communication system. Conventional semiconductor light receiving elements of this kind include a loading-type semiconductor light receiving element (see, for example, Japanese Patent Laid-Open No. 2003-332613, section [0016] and FIGS. 1, 2, and 3). In this structure, light is caused to enter a guide layer transparent to incident light on the cleaved end face and is guided to a photoelectric conversion section (light absorption layer) formed at a distance of several microns from the incidence section, and light oozing out of the guide layer in the layer thickness direction (evanescent light) is photoelectrically converted in the photoelectric conversion section. This photoelectric conversion is in an indirect form such that the concentration of photocurrents in the vicinity of the incidence end surface is reduced. This arrangement therefore has the advantage of ensuring that a reduction in response speed or breakdown of the light receiving device cannot occur easily even when a high intensity of light is input.

On the other hand, since light oozing out of the guide layer in the layer thickness direction is photoelectrically converted, obtaining high sensitivity requires a substantial waveguide length in theory. However, if the wavelength length is increased for the purpose of obtaining high sensitivity, the element capacity of the light receiving element is increased and there is a possibility of failure to achieve the desired high-speed response performance. That is, the sensitivity and high-speed response are in a trade-off relationship.

Also, there is a need to cover side surfaces of the guide layer and the photoelectric conversion section with a film of a non-semiconductor material (e.g., SiN film) having a high refractive index ratio to the materials forming the guide layer and the photoelectric conversion section in order to improve optical confinement in the guide layer and to thereby reduce loss due to radiation to portions other than the photoelectric conversion section. However, a recombination level or the like can occur easily at the semiconductor/non-semiconductor interface. In some situation, there is an anxiety about degradation of the guide layer end surface on which light is concentrated and the photoelectric conversion section to which a high electric field is applied.

Known light receiving elements proposed to solve these problems include a buried-waveguide-type light receiving element having a construction in which a waveguide layer is embedded in a Fe-doped InP (hereinafter referred to simply as Fe—InP) (see, for example, "40 Gbps waveguide type PD for mounting flip chip" Eitaro Ishimura, Masaharu Nakamichi and others, The 49th applied physics consociated lecture 2002 (Heisei 14) Spring lecture proceedings (2002.3 Tokai University), p. 1152, 27a-ZG-7).

In this construction, an optical confinement layer and a light absorption layer are embedded in Fe—InP constituted of a semiconductor and protected to ensure high reliability.

Also the element has such a structure that light directly enter the light absorption layer through a window layer. Therefore high sensitivity can be obtained even if the wavelength length is not so long, and high-sensitivity and high-speed-response characteristics can be obtained.

Another known disclosed art is a waveguide-type semiconductor light receiving element in which a 0.6 µm thick boundary layer of an n-optical confinement layer adjacent to a light absorption layer and a 0.3 pn thick boundary layer of a p-optical confinement layer adjacent to the light absorption layer are each formed as a non-doped layer (see, for example, Japanese Patent Laid-Open No. 10-303449, section [0030] and FIGS. 1 and 2).

Still another known disclosed art is a loading-type semiconductor light receiving element in which an i-InAlGaAs guide layer (wavelength composition 1.3 µm, layer thickness 0.2 µm) is formed below a light absorption layer, which has an increased depletion layer and a reduced junction capacity, and which is capable of high-speed response (see, for example, Japanese Patent Laid-Open No. 2001-168371, section [0030] and FIGS. 1 and 2).

A further known disclosed art is a waveguide-type light receiving element in which a multilayer structure having a light absorption layer p-type doped, light guide layers provided on opposite sides of the light absorption layer, the light guide layer on one side being uniformly p-type doped, the light guide layer on the other side having a low-concentration layer (e.g., an undoped layer) and an n-doped layer successively formed from the light absorption layer, is provided in mesa form on a semi-insulating InP substrate, and in which light horizontally enters the layer structure (see, for example, Japanese Patent Laid-Open No. 11-112013, sections [0004], [0008], [0009] and [0012] and FIG. 1).

Still a further known disclosed art is a semiconductor light receiving element in which an n-InGaAsP light guide layer is provided on a semi-conducting InP substrate, and a waveguide structure including an n-InP electron travel layer in mesa form, an InGaAsP layer in an undoped and n-type two-layer structure and a p-InGaAs light absorption layer (see, for example, Japanese Patent Laid-Open No. 2000-124493, sections [0004], [3008], [0009] and [0012] and FIG. 1).

Still a further known disclosed art is a waveguide-type avalanche photodiode for 40 Gbps communication (see, for example, "Waveguide-type avalanche photodiode for 40 Gbps communication" Shogo Shimizu, Kazuhiro Shiba and others, Shingaku-Giho, IEICE Technical Report OCS2006-40, OPE2006-93, LQE2006-82(2006-10), pp. 11-15).

In the conventional buried-waveguide-type light receiving element having a waveguide embedded in a Fe—InP layer, however, there is a problem that there is a possibility of mutual diffusion of a p-type dopant and Fe being caused by regrowth of the Fe—InP layer after the formation of the waveguide to cause an increase in dark current between the light absorption layer and the n-type optical confinement layer, i.e., an increase in leak current. As a method for preventing this, increasing the layer thickness of the light absorption layer is conceivable. With this method, however, there is a problem that a reduction in high-speed response and deterioration in high optical input resistance are caused.

SUMMARY OF THE INVENTION

The present invention has been made to solve the problem, and a first object of the present invention is to provide a buried-waveguide-type light receiving element which has a reduced leak current and high sensitivity, which is capable of operating at a high speed, and which has a waveguide embedded in a Fe-doped insulating layer. A second object of the present invention is to provide a manufacturing method capable of easily manufacturing a buried-waveguide-type light receiving element which has a reduced leak current and high sensitivity, which is capable of operating at a high speed, and which has a waveguide embedded in a Fe-doped insulating layer.

According to one aspect of the invention, there is provided a buried-waveguide-type light receiving element according to the present invention comprising: a semiconductor substrate; an n-type cladding layer located on the semiconductor substrate and having a refractive index; a waveguide layer located on a portion of the n-type cladding layer, and the waveguide layer including an n-type light guide layer having an impurity concentration, a first semiconductor layer having a refractive index equal to or higher than that of the n-type cladding layer and undoped or having an impurity concentration of $1\times10^{17}$ cm$^{-3}$ or less, lower than the impurity concentration of the n-type light guide layer, a light absorption layer having a refractive index higher than that of the first semiconductor layer, a p-type light guide layer and a p-type cladding layer successively layered in ridge form from the semiconductor substrate side; and a Fe-doped insulating material layer located on the semiconductor substrate and embedding side walls of the waveguide layer.

Accordingly, in the buried-waveguide-type light receiving element according to the present invention, the first semiconductor layer undoped or having an impurity concentration of $1\times10^{17}$ cm$^{-3}$ or less is provided between the n-type light guide layer and the light absorption layer to increase the depletion layer, thereby reducing dark current even if a p-type dopant diffuses into the light absorption layer from the p-type light guide layer via the Fe-doped insulating material layer.

Thus, a buried-waveguide-type light receiving element having a reduced leak current and high sensitivity, capable of operating at a high speed and embedded in a Fe-doped insulating material layer and, hence a buried-waveguide-type light receiving element having a high S/N ratio and high power efficiency can be constructed.

According to another aspect of the present invention, there is provided a manufacturing method of a buried-waveguide-type light receiving element according to the present invention comprises: forming a semiconductor multilayer structure by successively forming on a semiconductor substrate an n-type cladding layer having a refractive index, an n-type light guide layer having an impurity concentration, a first semiconductor layer having a refractive index equal to or higher than that of the n-type cladding layer and undoped or having an impurity concentration of $1\times10^{17}$ cm$^{-3}$ or less, lower than the impurity concentration of the n-type light guide layer, a light absorption layer having a refractive index higher than that of the first semiconductor layer, a p-type light guide layer and a p-type cladding layer; forming a waveguide layer layered in ridge form by forming a mask pattern on a surface of the semiconductor multilayer structure by photolithography, performing etching using the mask pattern as a mask until the n-type guide layer is completely removed from the surface of the semiconductor multilayer structure; and embedding side walls of the waveguide layer in a Fe-doped insulating material by selective growth using the mask pattern used for etching as a mask.

Accordingly, in the manufacturing method of a buried-waveguide-type light receiving element according to the present invention, in case of embedding side walls of the waveguide layer in a Fe-doped insulating material by selective growth, even if the p-type dopant diffuses in the light absorption layer to form a diffusion region, a narrow-depletion-layer region is not locally formed between the p-type dopant diffusion region formed in the light absorption layer and the n-light guide layer since the first semiconductor layer is inserted between the light absorption layer and the n-light guide layer.

Therefore, the method allows a simple process to manufacture a buried-waveguide-type light receiving element which has a reduced leak current and high sensitivity, which is capable of operating at a high speed, and which has a waveguide embedded in a Fe-doped insulating layer.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

Embodiments of the present invention will be described with respect to a buried-waveguide-type photo-detector (PD) used as a light receiving element in an optical communication system.

First Embodiment

Figure 1:
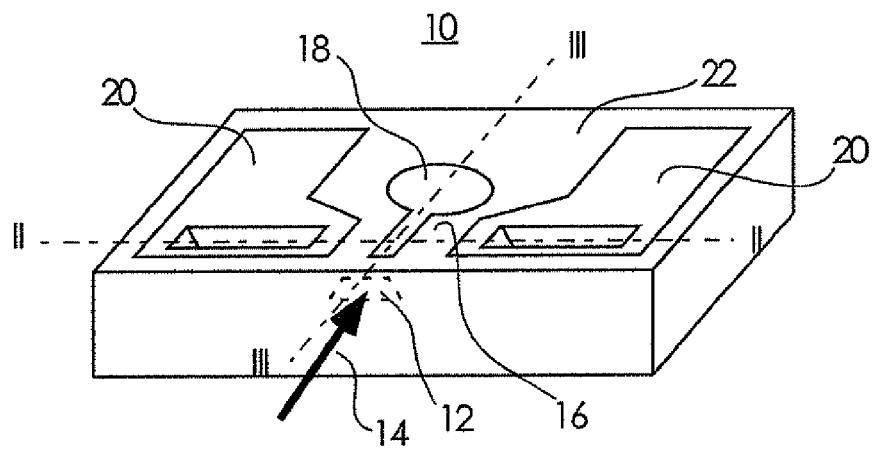
FIG. 1 is a perspective view of a buried-waveguide-type light receiving element according to one embodiment of the present invention.

FIG. 1 is a perspective view of a buried-waveguide-type light receiving element according to one embodiment of the present invention.

Referring to FIG. 1, a light receiving portion 12 in a front cleaved end face of the buried-waveguide-type pin-PD 10 receives signal light 14 indicated by the arrow. Signal light 14 has a center wavelength $\lambda 1$ is 1.55 μm, for example.

A waveguide mesa 16 including a waveguide into which signal light is introduced through the light receiving portion 12 in the cleaved end face is provided on the upper surface side of the pin-PD 10. A Ti/Pt/Au p-electrode 18 is provided along a surface of the waveguide mesa 16, and a Ti/Au n-electrode 20 is provided on two side surfaces of the waveguide mesa 16 and an upper surface of the pin-PD 10. The upper surface portion other than the portions on which the p-electrode 18 and the n-electrode 20 are provided is covered with an insulating film 22.

Figure 2:
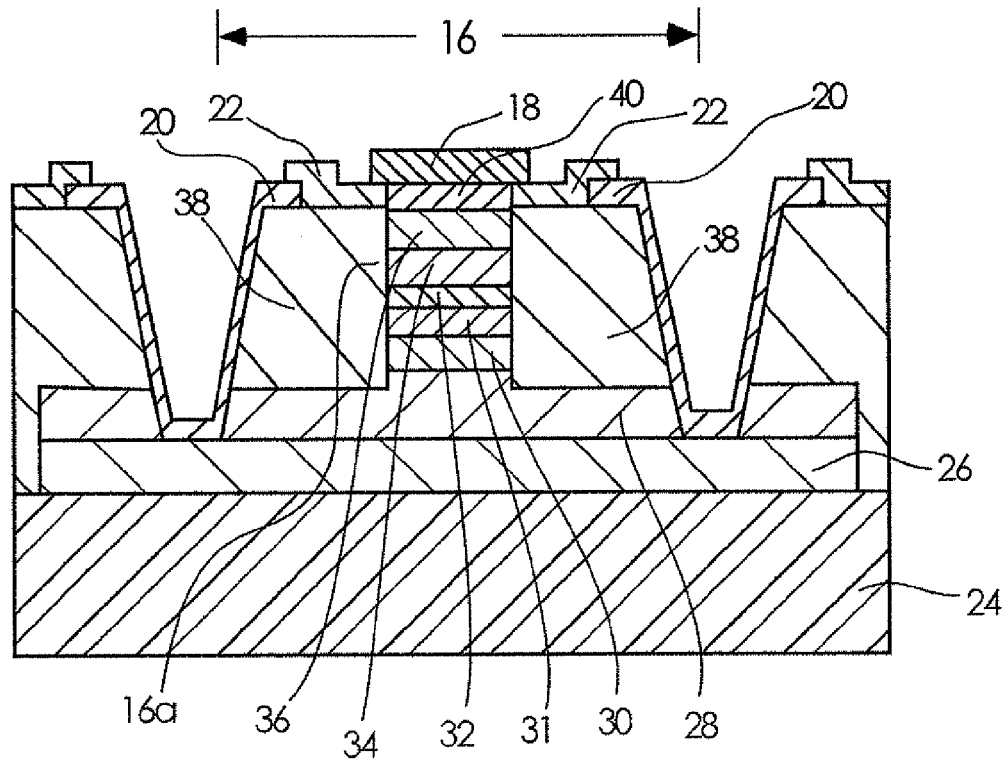
FIG. 2 is a sectional view of the buried-waveguide-type light receiving element taken along line II-II in FIG. 1.

FIG. 2 is a sectional view of the buried-waveguide-type light receiving element taken along line II-II in FIG. 1, i.e., a sectional view along a direction intersecting the direction of incidence of signal light, or a sectional view perpendicular to the waveguide direction.

Figure 3:
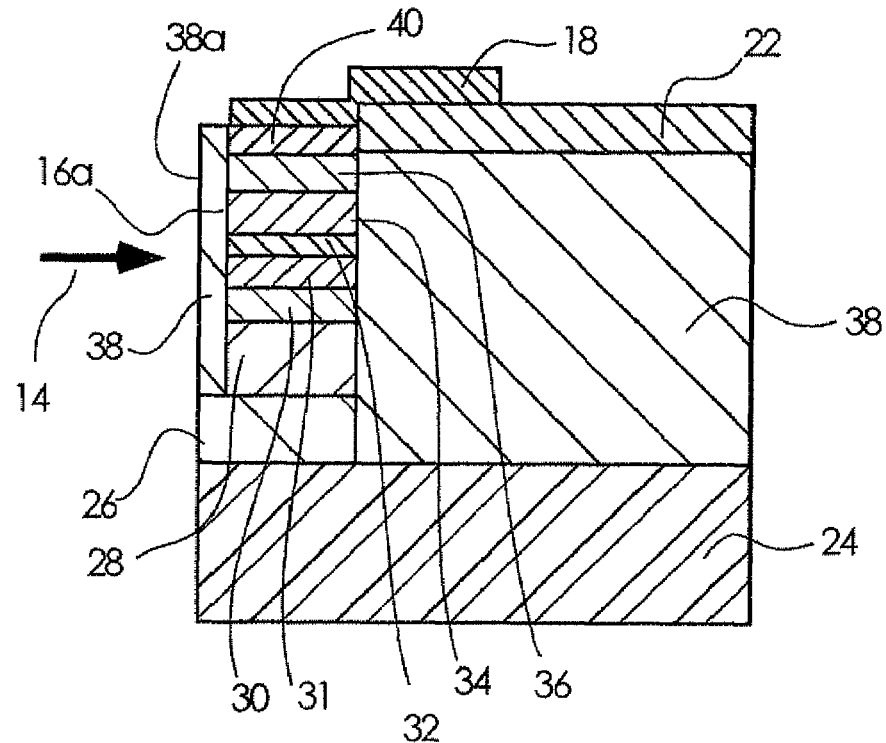
FIG. 3 is a sectional view of the buried-waveguide-type light receiving element taken along line III-III in FIG. 1.

FIG. 3 is a sectional view of the buried-waveguide-type light receiving element taken along line III-III in FIG. 1, i.e., a sectional view along the direction of incidence of signal light or a sectional view along the waveguide extension direction.

In the drawings, the same reference numerals denote the same or corresponding portions.

Referring to FIG. 2, an n-contact layer 26 formed of n-type InGaAs ("n-type" hereinafter referred to simply as "n-", "p-type" as "p-", and "undoped" as "i-") and an n-InP n-cladding layer 28 are successively provided in this order on a semiconductor substrate, e.g., a semi-insulating Fe—InP substrate 24. The waveguide mesa 16 into which signal light is introduced through the light receiving portion 12 is provided on the n-cladding layer 28.

The waveguide mesa 16 has a waveguide 16a as a waveguide layer and a Fe—InP block layer 38.

The waveguide 16a is formed in ridge form by successively layering part of the n-cladding layer 28 in a central portion of the same, an n-InGaAsP n-light guide layer 30 provided on the surface of the central part of the n-cladding layer 28, an i-InGaAsP i-light guide layer 31 provided as a first semiconductor layer on the surface of the n-light guide layer 30, an i-InGaAs light absorption layer 32 provided on the surface of the i-light guide layer 31, a p-InGaAsP p-light guide layer 34 provided on the surface of the light absorption layer 32, a p-InP p-cladding layer 36 provided on the surface of the p-light guide layer 34, and a p-InGaAs p-contact layer 40 provided on the surface of the p-cladding layer 36.

The Fe—InP block layer 38 as a Fe-doped insulating material layer is provided on the opposite sides of the waveguide 16a, and forms the side surfaces of the waveguide mesa 16.

If the block layer 38 provided on the opposite sides of the waveguide 16a is formed of a material having a refractive index lower than that of the light absorption layer 32, the refractive index difference from the waveguide 16a can be increased. In this way, the optical confinement efficiency can be increased, thereby increasing the light receiving sensitivity of the light receiving element.

Further, the p-electrode 18 is disposed so as to cover the surface of the p-contact layer 40, and the n-electrode 20 is disposed so as to cover the opposite side surfaces of the block layer 38 and contacts with the surface of the n-contact layer 26. The insulating film 22 is provided on the surface of the waveguide mesa 16 not covered with either of the p-electrode 18 and the n-electrode 20. The p-electrode 18 and the n-electrode 20 are electrically separated from each other by the insulating film 22.

Referring to FIG. 3, the pin-PD 10 has a cleaved end face 38a on the light receiving side in front of the waveguide 16a. For example, the Fe—InP block layer 38 is provided on the light receiving side in front of the waveguide 16a. The Fe—InP block layer 38 is also provided on the rear side of the waveguide 16a. That is, the waveguide 16a is embedded in the Fe-doped InP block layer 38 and is cleaved in the block layer 38 to be formed as a chip. Signal light is introduced into the waveguide 16a through the light receiving portion 12 of the cleaved end face of the block layer 38.

In this embodiment, the length of the waveguide 16a in the longitudinal direction, i.e., in the direction in which light travels, is 20 μm and the width of the waveguide 16a is 4 μm.

In this embodiment, the layer thickness da of the light absorption layer 32 is, for example, 350 nm and the layer thickness of the i-light guide layer 31 is 150 nm.

In this embodiment, if Be is used as a p-type dopant, mutual diffusion with Fe—InP is about 450 nm. Therefore, insertion of the i-light guide layer 31 is sufficiently effective in reducing dark current. The layer thicknesses of the light absorption layer 32 and the i-light guide layer 31 of this embodiment are only an example. Selection from various thickness values may be made by considering the frequency characteristics, the dark current characteristics, the concentration of the p-type dopant used, the Fe concentration in the Fe—InP layer and so on.

For example, in a case where mutual diffusion of the p-type dopant and Fe in the Fe—InP layer is extremely small or in a case where the layer thickness of the light absorption layer 32 is larger, a substantial effect of reducing dark current can be obtained even when the layer thickness of the i-light guide layer 31 is about 50 nm. The dark current characteristics can be improved by increasing the layer thickness of the i-light guide layer 31 within a range in which there is no problem with the frequency characteristics and the operating voltage in use. For example, with respect to the operation at several volts, the i-light guide layer 31 can be sufficiently depleted and a suitable dark current characteristic can be therefore obtained, if the layer thickness of the i-light guide layer 31 is 1 μm or less. From the viewpoint of high-speed response for operating the light receiving element for 40 Gbps communication, it is desirable to set the layer thickness of the i-light guide layer 31 to 300 nm or less. If the layer thickness of the i-light guide layer 31 is set within the range from 100 nm to 200 nm, a good dark current characteristic can be obtained without deteriorating the frequency characteristics.

The refractive index of InGaAsP used as the material of the n-light guide layer 30 and the p-light guide layer 34 is higher than that of the material of the n-cladding layer 28 and the p-cladding layer 36. The wavelength kg obtained from the optical bandgap of the material of the n-light guide layer 30, the i-light guide layer 31 and the p-light guide layer 34 is 1.4 µm.

In this embodiment, the refractive index of the i-light guide layer 31 is set higher than that of the n-cladding layer 28. However, the refractive index of the i-light guide layer 31 may be the same as that of the n-cladding layer 28.

The refractive index of the i-light guide layer 31 is set lower than that of the light absorption layer 32.

As an n-type impurity in each layer, a IV group element such as Si or S is added. As a p-type impurity, a II group element such as Be or Zn is added. In pin-PD 10, the light absorption layer 32 is undoped; any impurity is not specially added thereto.

The carrier concentration is $1 \times 10^{18}$ cm$^{-3}$ in each of the n-contact layer 26, the n-cladding layer 28 and the n-light guide layer 30. The i-light guide layer 31 is undoped in this embodiment, but it may have an n-type carrier concentration of $1 \times 10^{17}$ cm$^{-3}$ or less, e.g., $1 \times 10^{14}$ cm$^{-3}$ to $1 \times 10^{17}$ cm$^{-3}$.

In the other layers, the carrier concentration in the p-light guide layer 34 is $1 \times 10^{15}$ cm$^{-3}$, the carrier concentration in the p-cladding layer 36 is $5 \times 10^{15}$ cm$^{-3}$, and the carrier concentration in the p-contact layer 40 is $1 \times 10^{19}$ cm$^{-3}$.

Thus, in the waveguide 16*a*, the p-light guide layer 34, the n-light guide layer 30 and the light absorption layer 32 interposed between these light guide layers form p/i/n junctions, including the i-light guide layer 31.

A method of manufacturing the pin-PD 10 in this embodiment will be outlined.

First, an n-InGaAs layer as n-contact layer 26, an n-InP layer as n-cladding layer 28, an n-InGaAsP layer as n-light guide layer 30, an n-InGaAsP layer as i-light guide layer 31, an i-InGaAs layer as light absorption layer 32, a p-InGaAsP layer as p-light guide layer 34, a p-InP layer as p-cladding layer 36 and a p-InGaAs layer as p-contact layer 40 are formed one on another to a predetermined thickness on semi-insulating Fe-doped InP substrate 24 by a vapor phase epitaxial growth method, e.g., an MOCVD method.

Subsequently, SiO$_2$ film is formed on the surface of the p-InGaAs layer formed as the uppermost p-contract layer 40 in the layers in the multilayer structure to form an insulating film pattern having a peripheral opening, with SiO$_2$ film left in correspondence with the upper surface of the waveguide 16*a* to be formed. Etching is performed by using this insulating film pattern as a mask to form the waveguide 16*a* having a light-traveling longitudinal direction length of 20 µm and a width of 4 µm. In this etching, the insulating film pattern is worked in steps to form the portions to be formed by stopping etching when the n-InP layer formed as n-cladding layer 28 is completely exposed, i.e., the front surface and two side surface portions of the waveguide 16*a*, and the portion on which etching is performed until the InP substrate 24 is exposed, i.e., the rear portion of the waveguide 16*a*.

Subsequently, damaged layers formed during dry etching are removed by wet etching, and selective growth is performed by using the insulating film pattern used for etching to form block layer 38 such that the waveguide 16*a* is embedded in Fe—InP. In this embedding growth, the SiO$_2$ insulating film pattern is left as a selective growth film to enable prevention of regrowth of Fe—InP on the waveguide 16*a* and enable the waveguide 16*a* to be embedded in the block layer 38 so that the light receiving device surface is flat. The Fe concentration in the block layer 38 is, for example, about $1 \times 10^{17}$ cm$^{-3}$.

Subsequently, the insulating film pattern is removed and a new insulating film pattern is formed by a photolithography process; waveguide mesa 16 is formed by wet etching, n-electrode 20 is formed; insulating film 22 of SiN is formed by using a p-CVD apparatus; and p-electrode 18 is formed.

Thereafter, the back surface of the InP substrate 24 is etching to a suitable thickness and a back-surface metal for bonding is formed, thus completing the wafer process.

In the pin-PD 10 thus constructed, embedding growth for filling the space around the waveguide 16*a* with FeInP is performed after forming the waveguide 16*a*. In the course of embedding growth, mutual diffusion of the p-type impurity contained in the p-light guide layer 34, e.g., Be or Zn and Fe in the Fe—InP layer occurs and the p-type dopant diffuses in the Fe—InP layer.

The p-type dopant, e.g., Be or Zn has a high rate of mutual diffusion with Fe and, therefore, diffuses to the side surface of the light absorption layer 32 in a short time and diffuses gradually inside the light absorption layer 32.

In the pin-PD 10 according to this embodiment, even if the p-type dopant diffuses in the light absorption layer 32 to form a diffusion region, a narrow-depletion-layer region is not locally formed between the p-type dopant diffusion region formed in the light absorption layer 32 and the n-light guide layer 30 since the i-light guide layer 31 is inserted between the light absorption layer 32 and the n-light guide layer 30.

That is, the depletion layer corresponding to the layer thickness of the i-light guide layer 31 is added, so that the depletion layer corresponding to the layer thickness of the i-light guide layer 31 is secured in addition to the depletion layer in the light absorption layer 32.

Therefore, the increase in the electric field between the p-type dopant diffusion region in the light absorption layer 32 and the n-light guide layer 30 is limited. Consequently, prevention of an increase in dark current flowing from the light absorption layer 32 to the n-light guide layer 30 can be achieved and, hence, prevention of a reduction in S/N ratio of the light receiving element can be achieved.

Further, since the bandgap of the i-light guide layer 31 is larger than that of the light absorption layer 32, dark current can be reduced by inserting the i-light guide layer 31. That is, in comparison with a case where the thickness of the light absorption layer 32 is increased by the amount corresponding to the thickness of the i-light guide layer 31, and where the same electric field is applied, the arrangement in which the i-light guide layer 31 is inserted is theoretically more effective in reducing dark current.

Figure 4:
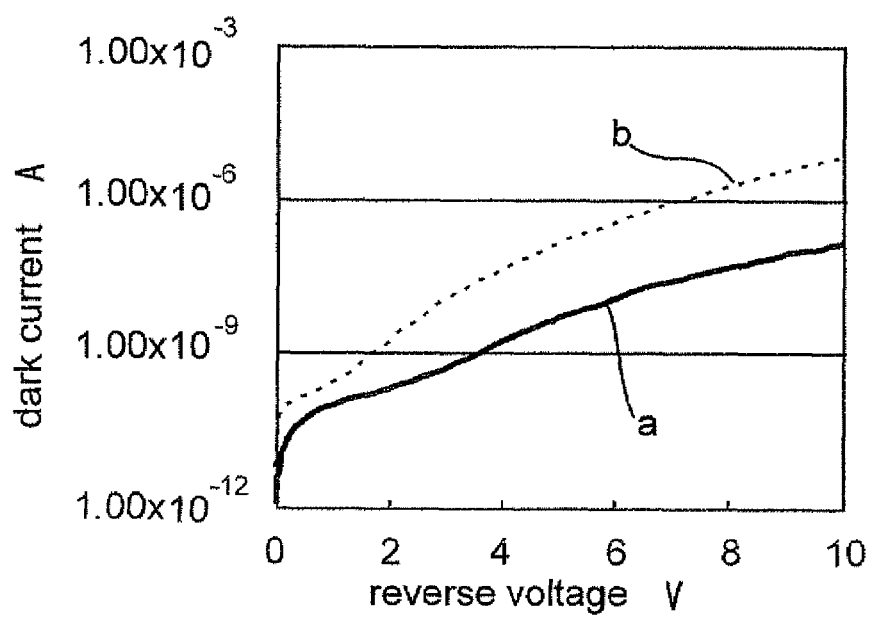
FIG. 4 is a graph showing a voltage-current characteristic of the buried-waveguide-type light receiving element according to one embodiment of the present invention.

FIG. 4 is a graph showing a voltage-current characteristic of the buried-waveguide-type light receiving element according to one embodiment of the present invention.

In FIG. 4, the abscissa represents the reverse voltage and the ordinate represents the dark current. Also, a solid line curve a indicates the voltage-current characteristic of the buried-waveguide-type light receiving element in a case where the i-light guide layer 31 is inserted as in the embodiment, and a broken line curve b indicates, for comparison, the voltage-current characteristic of the buried-waveguide-type light receiving element in a case where the i-light guide layer 31 is not inserted.

As shown in FIG. 4, when the same reverse voltage is applied, the dark current is reduced by inserting the i-light guide layer 31.

In the buried-waveguide-type light receiving element according to this embodiment, the waveguide 16*a* embedded in the Fe—InP layer has the i-light guide layer 31 inserted between the light-absorption layer 32 and the n-light guide layer 30. Therefore, even if a diffusion region of the p-type dopant diffused via the Fe—InP layer is formed in the light absorption layer 32, a sufficient depletion layer thickness is secured between the p-type dopant diffusion region and the n-light guide layer 30. The increase in the electric field is suppressed and, hence, the increase in dark current is thereby limited. In this way, a reduction in S/N ratio of the light receiving element can be prevented.

MODIFIED EXAMPLE 1

Figure 5:
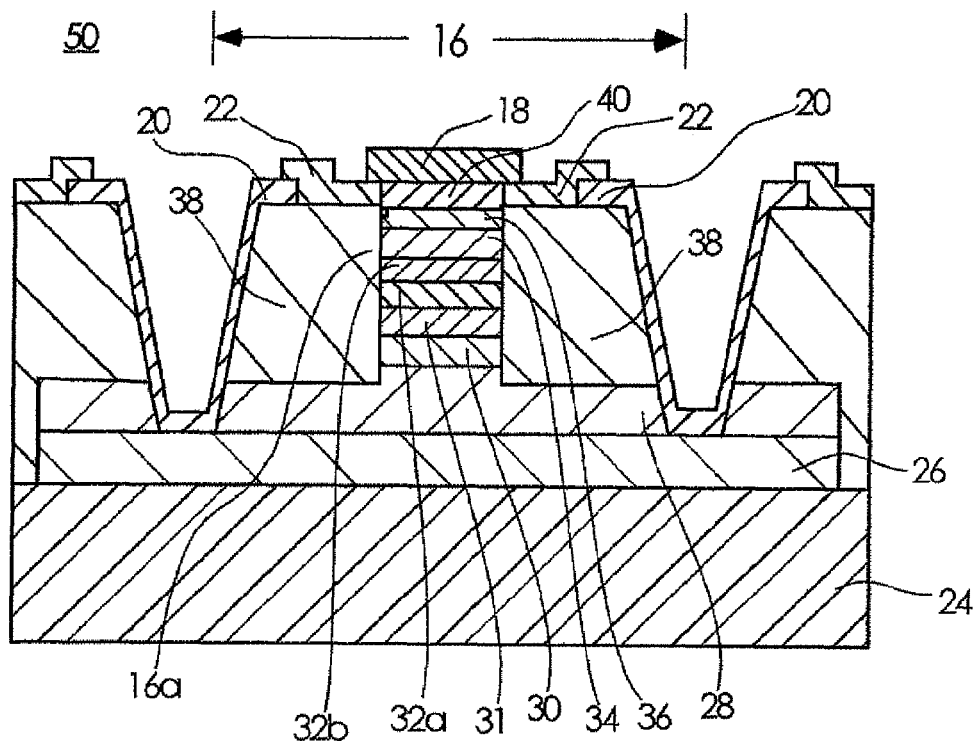
FIG. 5 is a sectional view of a modified example of the buried-waveguide-type light receiving element according to one embodiment of the present invention.
Figure 6:
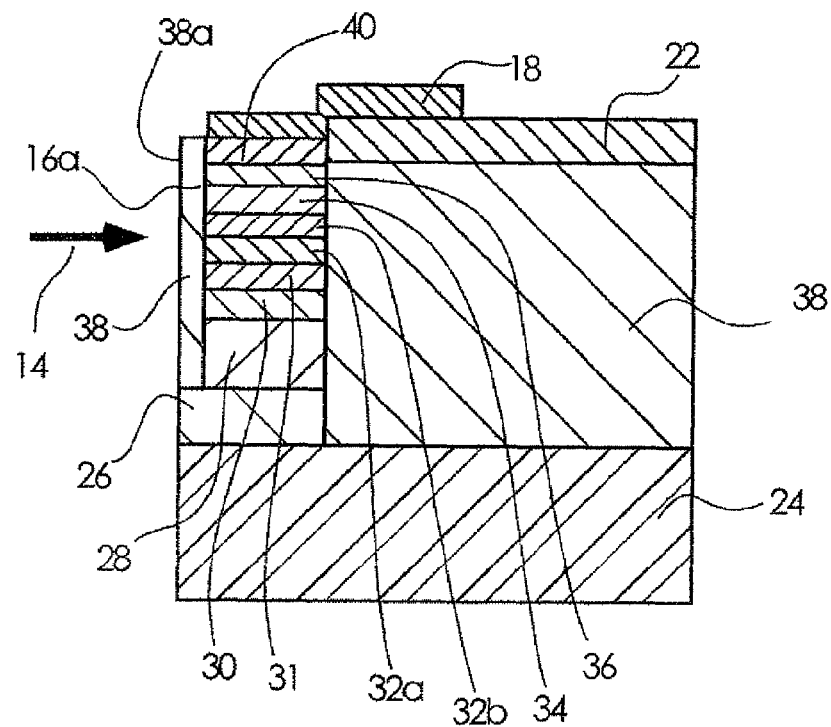
FIG. 6 is a sectional view of the modified example of the buried-waveguide-type light receiving element according to one embodiment of the present invention taken along the waveguide extension direction.

FIG. 5 is a sectional view of a modified example of the buried-waveguide-type light receiving element according to one embodiment of the present invention. The section shown in FIG. 5 is perpendicular to the waveguide direction. FIG. 6 is a sectional view of the modified example of the buried-waveguide-type light receiving element according to one embodiment of the present invention taken along the waveguide extension direction.

A perspective view of the buried-waveguide-type light receiving element in this modified example 1 is the same as FIG. 1 shown as a perspective view of the buried-waveguide-type light receiving element in the first embodiment.

Accordingly, FIG. 5 is a sectional view of the buried-waveguide-type light receiving element taken along line II-II in FIG. 1, i.e., a sectional view along a direction intersecting the direction of incidence of signal light, and FIG. 6 is a sectional view of the buried-waveguide-type light receiving element taken along line III-III in FIG. 1, i.e., a sectional view along the direction of incidence of signal light.

The construction of a pin-PD 50 shown in FIGS. 5 and 6 differs from that of the pin-PD 10 shown in FIGS. 2 and 3 in that while the light absorption layer in the pin-PD 10 is formed only of the i-InGaAs light absorption layer 32, the light absorption layer in the pin-PD 50 is formed of an i-InGaAs first light absorption layer 32a provided subsequently to the i-light guide layer 31 and a p-InGaAs second light absorption layer 32b formed subsequently to the first light absorption layer 32a, and the p-light guide layer 34 is formed subsequently to the second light absorption layer 32b.

Also, the method of manufacturing the pin-PD 50 differs from the method of manufacturing the pin-PD 10 only in that the i-InGaAs first light absorption layer 32a and the p-InGaAs second light absorption layer 32b formed subsequently to the first light absorption layer 32a are formed in the layering process in the manufacturing method.

In this modified example, the first light absorption layer 32a is formed of i-InGaAs. However, the carrier concentration in the first light absorption layer 32a may be so low that the light absorption layer is sufficiently depleted during operation. For example, the carrier concentration may be $1 \times 10^{14}$ cm$^{-3}$ to $1 \times 10^{16}$ cm$^{-3}$. Also, the carrier concentration in the second light absorption layer 32b is $1 \times 10^{17}$ cm$^{-3}$ to $1 \times 10^{18}$ cm$^{-3}$. It is designed so that photocarriers generated in the second light absorption layer 32b receive the internal electric field to cause overshoot of the mobility of electrons.

In the pin-PD 50 in this modified example, the layer thicknesses of the i-light guide layer 31, the first light absorption layer 32a and the second light absorption layer 32b are 150 nm, 350 nm and 100 nm, respectively. The layer thicknesses of the i-light guide layer 31, the first light absorption layer 32a and the second light absorption layer 32b of this modified example are only an example, and selection from various thickness values may be made by considering the frequency characteristics, the dark current characteristics, the concentration of the p-type dopant used, the Fe concentration in the Fe—InP layer and so on.

For example, in a case where mutual diffusion of the p-type dopant and Fe in the Fe—InP layer is extremely small or in a case where the layer thickness of the light absorption layer 32 is larger, a substantial effect of reducing dark current can be obtained even when the layer thickness of the i-light guide layer 31 is about 50 nm. The dark current characteristics can be improved by increasing the layer thickness of the i-light guide layer 31 within a range in which there is no problem with the frequency characteristics and the operating voltage in use. For example, with respect to the operation at several volts, the i-light guide layer 31 can be sufficiently depleted and a suitable dark current characteristic can therefore be obtained, if the layer thickness of the i-light guide layer 31 is 1 µm or less. From the viewpoint of high-speed response for operating the light receiving element for 40 Gbps communication, it is desirable to set the layer thickness of the i-light guide layer 31 to 300 nm or less. If the layer thickness of the i-light guide layer 31 is set within the range from 100 nm to 200 nm, a good dark current characteristic can be obtained without deteriorating the frequency characteristics.

In other respects, the arrangement of the pin-PD 50 is the same as that of the pin-PD 10 in the first embodiment. The pin-PD 50 has the same advantages as the pin-PD 10.

Modified Example 2

Figure 7:
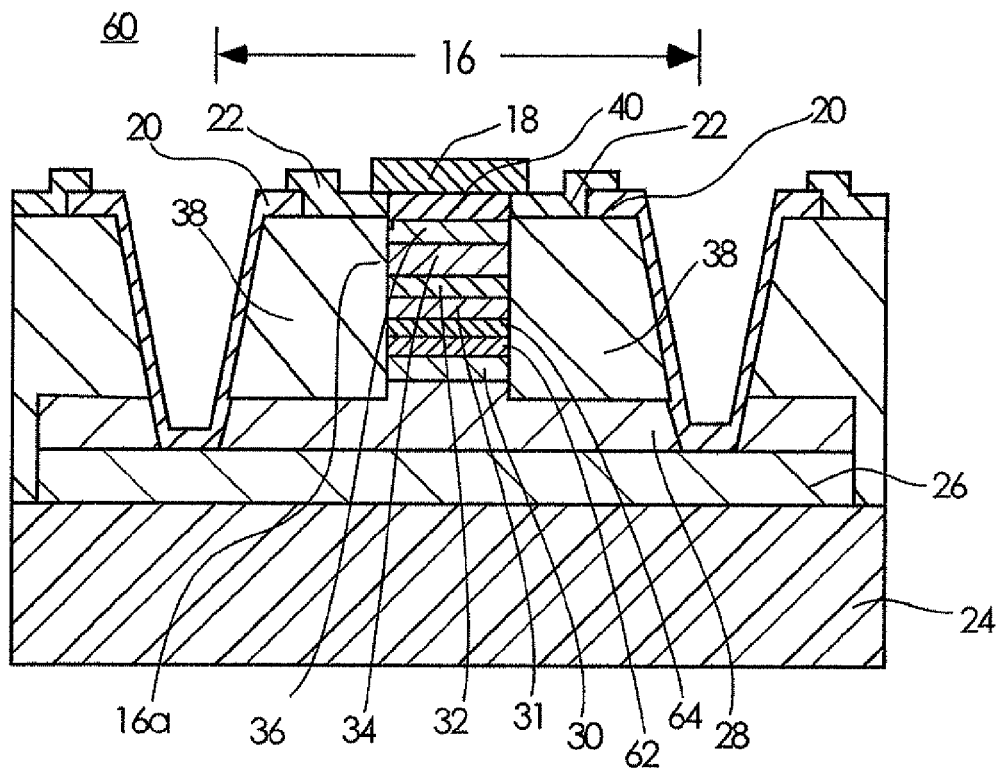
FIG. 7 is a sectional view of a modified example of the buried-waveguide-type light receiving element according to one embodiment of the present invention.
Figure 8:
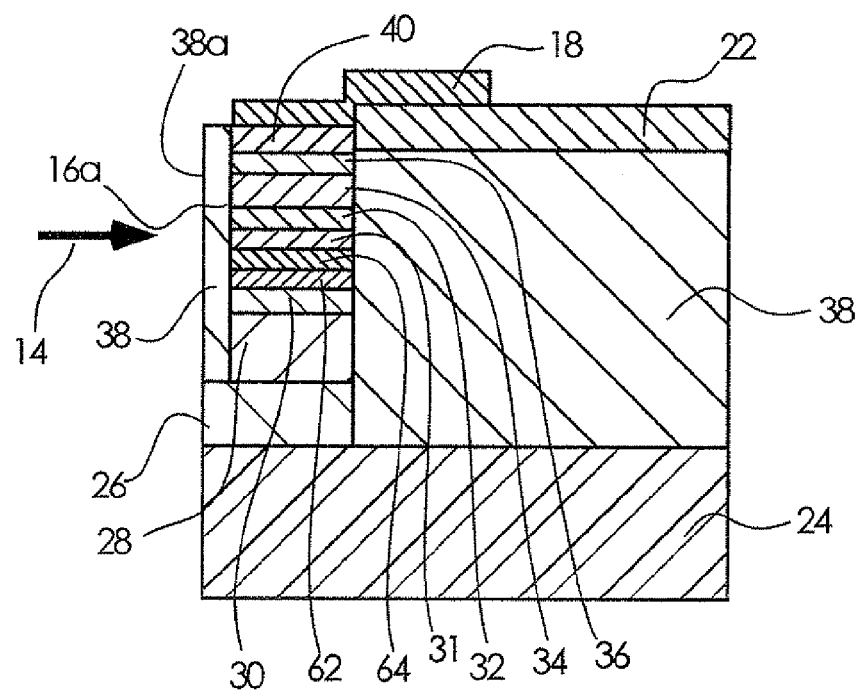
FIG. 8 is a sectional view of the modified example of the buried-waveguide-type light receiving element according to one embodiment of the present invention taken along the waveguide extension direction.

FIG. 7 is a sectional view of a modified example of the buried-waveguide-type light receiving element according to one embodiment of the present invention. The section shown in FIG. 7 is perpendicular to the waveguide direction. FIG. 8 is a sectional view of the modified example of the buried-waveguide-type light receiving element according to one embodiment of the present invention taken along the waveguide extension direction.

A perspective view of the buried-waveguide-type light receiving element in this modified example 2 is the same as FIG. 1 shown as a perspective view of the buried-waveguide-type light receiving element in the first embodiment. Accordingly, FIG. 7 is a sectional view of the buried-waveguide-type light receiving element taken along line II-II in FIG. 1, i.e., a sectional view along a direction intersecting the direction of incidence of signal light, and FIG. 8 is a sectional view of the buried-waveguide-type light receiving element taken along line III-III in FIG. 1, i.e., a sectional view along the direction of incidence of signal light.

The buried-waveguide-type light receiving element shown in FIGS. 7 and 8 is an avalanche photo-diode (APD).

The construction of APD 60 shown in FIGS. 7 and 8 differs from that of the pin-PD 10 shown in FIGS. 2 and 3 in that the n-light guide layer 30 is formed of n-AlInAs having a carrier concentration of $1 \times 10^{19}$ cm$^{-3}$, the i-light guide layer 31 is formed of AlInAs undoped or having an n-type carrier concentration of $1 \times 10^{17}$ cm$^{-3}$ or less, e.g., $1 \times 10^{14}$ cm$^{-3}$ to $1 \times 10^{17}$ cm$^{-3}$, and the p-light guide layer 34 is formed of n-AlInAs having a carrier concentration of $1 \times 10^{18}$ cm$^{-3}$.

Further, in addition to the construction of the pin-PD 10, a multiplication layer 62 formed of AlInAs undoped or having an n-type carrier concentration of, for example, $1 \times 10^{14}$ cm$^{-3}$ to $1 \times 10^{16}$ cm$^{-3}$ and an electric field adjustment layer 64 formed of p-AlInAs having a carrier concentration of, for example, $1 \times 10^{18}$ cm$^{-3}$ are successively provided from the n-light guide layer 30 side between the n-light guide layer 30 and the i-light guide layer 31.

Also, the method of manufacturing the APD 60 differs from the method of manufacturing the pin-PD 10 only in that the n-light guide layer 30 is formed of n-AlInAs having a carrier concentration of $1 \times 10^{19}$ cm$^{-3}$, the i-light guide layer 31 is formed of AlInAs undoped or having an n-type carrier concentration of $1\times10^{17}$ cm$^{-3}$ or less, e.g., $1\times10^{14}$ cm$^{-3}$ to $1\times10^{17}$ cm$^{-3}$, the p-light guide layer 34 is formed of n-AlInAs having a carrier concentration of $1\times10^{18}$ cm$^{-3}$, and an AlInAs layer provided as multiplication layer 62 and a p-AlInAs layer provided as electric field adjustment layer 64 are further formed from the n-light guide layer 30 side between the n-light guide layer 30 and the i-light guide layer 31.

In this modified example 2, each of the i-light guide layer 31 and the light absorption layer 32 has a layer thickness of 250 nm. Also, each AlInAs layer lattice matches with the InP substrate.

Also in this arrangement, the increase in the electric field between the p-type dopant diffusion region in the light absorption layer 32 and the n-light guide layer 30 is limited, as in the pin-PD 10 in the first embodiment. Consequently, prevention of an increase in dark current flowing from the light absorption layer 32 to the n-light guide layer 30 can be achieved and, hence, prevention of a reduction in S/N ratio of the light receiving element can be achieved.

Further, since the bandgap of the i-light guide layer 31 is larger than that of the light absorption layer 32, the arrangement in which the i-light guide layer 31 is inserted is theoretically more effective in reducing dark current in comparison with a case where the thickness of the light absorption layer 32 is increased by the amount corresponding to the thickness of the i-light guide layer 31, and where the same electric field is applied.

In the APD 60 in the modified example 2, the light absorption layer is formed of one light absorption layer 32. However, the light absorption layer may alternatively be formed of an i-InGaAs first light absorption layer 32a provided subsequently to the i-light guide layer 31 and a p-InGaAs second light absorption layer 32b formed subsequently to the first light absorption layer 32a, as is that in the pin-PD 50 in the modified example 1.

As described above, the buried-waveguide-type light receiving element according to the present invention comprising: a semiconductor substrate; an n-type cladding layer located on the semiconductor substrate and having a refractive index; a waveguide layer located on a portion of the n-type cladding layer, and the waveguide layer including an n-type light guide layer having an impurity concentration, a first semiconductor layer having a refractive index equal to or higher than that of the n-type cladding layer and undoped or having an impurity concentration of $1\times10^{17}$ cm$^{-3}$ or less, lower than the impurity concentration of the n-type light guide layer, a light absorption layer having a refractive index higher than that of the first semiconductor layer, a p-type light guide layer and a p-type cladding layer successively layered in ridge form from the semiconductor substrate side; and a Fe-doped insulating material layer located on the semiconductor substrate and embedding side walls of the waveguide layer.

In the buried-waveguide-type light receiving element according to the present invention, the first semiconductor layer undoped or having an impurity concentration of $1\times10^{17}$ cm$^{-3}$ or less is provided between the n-type light guide layer and the light absorption layer to increase the depletion layer, thereby reducing dark current even if a p-type dopant diffuses into the light absorption layer from the p-type light guide layer via the Fe-doped insulating material layer.

Thus, a buried-waveguide-type light receiving element having a reduced leak current and high sensitivity, capable of operating at a high speed and embedded in a Fe-doped insulating material layer and, hence a buried-waveguide-type light receiving element having a high S/N ratio and high power efficiency can be constructed.

As described above, the buried-waveguide-type light receiving element according to the present invention is suitable for a buried-waveguide-type light receiving element used in the optical communication system, having high sensitivity, required to operate at a high speed, and having a high S/N ratio and high power efficiency.

A methods for manufacturing a buried-waveguide-type light receiving element according to the present invention also is useful as a method for manufacturing such buried-waveguide-type light receiving elements.

While the presently preferred embodiments of the present invention have been shown and described. It is to be understood these disclosures are for the purpose of illustration and that various changes and modifications may be made without departing from the scope of the invention as set forth in the appended claims.

The invention claimed is:

1. A buried-waveguide light detecting element comprising:
   a semiconductor substrate;
   an n-type cladding layer located on the semiconductor substrate and having a refractive index;
   a waveguide layer located on a portion of the n-type cladding layer, the waveguide layer including
      an n-type light guide layer having an impurity concentration,
      a first semiconductor layer having a refractive index equal to or higher than that of the n-type cladding layer and undoped or having an impurity concentration of $1\times10^{17}$ cm$^{-3}$ or less, lower than the impurity concentration of the n-type light guide layer,
      a light absorption layer having a refractive index higher than that of the first semiconductor layer,
      a p-type light guide layer, and
      a p-type cladding layer successively layered in a ridge with respect to the semiconductor substrate; and
   a Fe-doped insulating material layer located on the semiconductor substrate and embedding side walls of the waveguide layer.

2. The buried-waveguide light detecting element according to claim 1, wherein the light absorption layer has an undoped first light absorption layer located in the light absorption layer toward the semiconductor substrate and a p-type second light absorption layer located in the light absorption layer toward the p-type light guide layer side.

3. The buried-waveguide light detecting element according to claim 1, further comprising an undoped multiplication layer and a p-type electric field adjustment layer successively located with respect to the semiconductor substrate, between the n-type light guide layer and the first semiconductor layer.

4. The buried-waveguide light detecting element according to claim 2, further comprising an undoped multiplication layer and a p-type electric field adjustment layer successively located with respect to the semiconductor substrate, between the n-type light guide layer and the first semiconductor layer.

5. The buried-waveguide light detecting element according to claim 1, wherein the first semiconductor layer has a thickness in a range from 50 nm to 1 μm.

6. The buried-waveguide light detecting element according to claim 1, wherein the first semiconductor layer is InGaAsP or InAlGaAs.

7. A method of manufacturing a buried-waveguide light detecting element, comprising:
   forming a semiconductor multilayer structure by successively forming, on a semiconductor substrate,
      an n-type cladding layer having a refractive index, an n-type light guide layer having an impurity concentration,
a first semiconductor layer having a refractive index equal to or higher than that of the n-type cladding layer and undoped or having an impurity concentration of $1\times10^{17}$ cm$^{-3}$ or less, lower than the impurity concentration of the n-type light guide layer,
a light absorption layer having a refractive index higher than that of the first semiconductor layer,
a p-type light guide layer, and
a p-type cladding layer;
forming a waveguide layer in ridge form by forming a mask pattern on a surface of the semiconductor multilayer structure by photolithography, etching, using the mask pattern as a masks until the n-type guide layer is completely removed from the surface of the semiconductor multilayer structure; and
embedding side walls of the waveguide layer in van Fe-doped insulating material by selective growth, using the mask pattern used for etching as a mask.

8. The method of manufacturing a buried-waveguide-light detecting element according to claim 7, wherein the light absorption layer includes an undoped first light absorption layer toward the semiconductor substrate in the light absorption layer and a p-type second light absorption layer in the light absorption layer on the first light absorption layer.

9. The method of manufacturing a buried-waveguide-light detecting element according to claim 7, further comprising successively forming an undoped multiplication layer and a p-type electric field adjustment layer with respect to the semiconductor substrates, between the n-type light guide layer and the first semiconductor layer.

10. The method of manufacturing a buried-waveguide-light detecting element according to claim 8, further comprising successively forming an undoped multiplication layer and a p-type electric field adjustment layer with respect to the semiconductor substrate, between the n-type light guide layer and the first semiconductor layer.

* * * * *